(12) United States Patent
Zukoski et al.

(10) Patent No.: US 11,281,817 B2
(45) Date of Patent: Mar. 22, 2022

(54) SYSTEMS AND METHODS FOR GENERATING PROGRAMMATIC DESIGNS OF STRUCTURES

(71) Applicant: Join, Inc., Berkeley, CA (US)

(72) Inventors: Andrew Zukoski, Berkeley, CA (US); Drew Wolpert, Berkeley, CA (US)

(73) Assignee: Join, Inc., Berkeley, CA (US)

( * ) Notice: Subject to any disclaimer, the term of this patent is extended or adjusted under 35 U.S.C. 154(b) by 827 days.

(21) Appl. No.: 16/127,137

(22) Filed: Sep. 10, 2018

(65) Prior Publication Data

US 2019/0080030 A1 Mar. 14, 2019

Related U.S. Application Data

(60) Provisional application No. 62/556,107, filed on Sep. 8, 2017.

(51) Int. Cl.
| | |
|---|---|
| *G06F 30/13* | (2020.01) |
| *G06T 17/00* | (2006.01) |
| *G06F 3/0482* | (2013.01) |

(52) U.S. Cl.
CPC ............ *G06F 30/13* (2020.01); *G06F 3/0482* (2013.01); *G06T 17/00* (2013.01)

(58) Field of Classification Search
CPC ........ G06F 30/13; G06F 3/0482; G06T 17/00
USPC .......................................................... 703/1
See application file for complete search history.

(56) References Cited

U.S. PATENT DOCUMENTS

| | | | | |
|---|---|---|---|---|
| 9,367,950 B1 * | 6/2016 | Scranton | ................. | G06T 15/10 |
| 10,346,768 B2 * | 7/2019 | Schnackel | ........ | G06Q 10/06315 |
| 2008/0300832 A1 * | 12/2008 | Ueda | ....................... | G06F 30/00 703/1 |
| 2010/0106654 A1 * | 4/2010 | Simpson | ................. | G06F 30/13 705/300 |
| 2011/0218777 A1 * | 9/2011 | Chen | ....................... | G06F 30/00 703/1 |

(Continued)

OTHER PUBLICATIONS

"Industry Foundation Classes", IFC Official Release, buildingSMART, Apr. 9, 2015, Retrieved from: https://web.archive.org/web/20150409013607/http://www.buildingsmart-tech.org/ifc/IFC4/final/html/.

(Continued)

*Primary Examiner* — Justin C Mikowski
(74) *Attorney, Agent, or Firm* — KPPB LLP

(57) ABSTRACT

Systems and methods for generating programmatic designs of structures in accordance with embodiments of the invention are illustrated. One embodiment includes a system for generating a programmatic description of a design of a structure, including a processing system, and a memory accessible by the processing system storing instructions that when read by the processing system direct the processing system to receive a visual description of a structure, identify features in the visual description of the structure, determine a list of candidate components corresponding to the identified features from the visual description of the structure, resolve parameters for each component in the list of candidate components, generate a programmatic description of the structure based on the list of candidate components of the resolved parameters and perform an error check to determine an amount that the programmatic description differs from the visual description.

18 Claims, 11 Drawing Sheets

(56) References Cited

U.S. PATENT DOCUMENTS

| | | | |
|---|---|---|---|
| 2012/0215500 A1* | 8/2012 | Ciuti | G06F 30/13 |
| | | | 703/1 |
| 2013/0006588 A1* | 1/2013 | Mulligan | G06F 30/18 |
| | | | 703/1 |
| 2013/0179207 A1* | 7/2013 | Perez Rodriguez | G06Q 10/06 |
| | | | 705/7.15 |
| 2016/0012359 A1* | 1/2016 | Wood | G06Q 10/0631 |
| | | | 705/7.12 |
| 2017/0308045 A1* | 10/2017 | Dibowski | G05B 15/02 |

OTHER PUBLICATIONS

"Join Unitized Curtainwall Sneak Peek", YouTube, Aug. 6, 2017, retrieved from https://www.youtube.com/watch?v=cqpxR0kTOUs on Sep. 21, 2017, 1 page.

* cited by examiner

```
         ┌─────────────┐
         │    Start    │──── 805
         └──────┬──────┘
                ▼
         ┌─────────────┐
         │ Receive inputs of │
         │ interaction with visual │
         │ representation │──── 810
         └──────┬──────┘
                ▼
    ┌──► ┌─────────────┐
    │    │ Synthesize selection │
    │    │   criteria  │──── 815
    │    └──────┬──────┘
    │           ▼
    │    ┌─────────────┐
 Yes│    │ Incorporate into model │
    │    │             │──── 820
    │    └──────┬──────┘
    │           ▼
    │    ┌─────────────┐
    │    │ Render structure with │
    │    │  added input │──── 820
    │    └──────┬──────┘
    │           ▼
    │    ┌─────────────┐
    │    │ Perform rule violation │
    │    │    check    │──── 825
    │    └──────┬──────┘
    │           ▼
    │       ◇ Rule violation? ◇
    └───────────┤
                │ No
                ▼
         ┌─────────────┐
         │     End     │
         └─────────────┘
```

```
                              ┌─ 900
┌─────────────────────────────┴──────────────────────────────────┐
│                                                                │
│                                    905                         │
│                                   ╱                            │
│         (let^ PlaceHeatingUnitInRoomRoomOutline                │
│                 (lambda                                        │
│                         (RoomOutline t, d)                     │
│          905                                                   │
│           ╲                                                    │
│             ╲(let chosen                                       │
│                     (if                                        │
│                              (gte (Area RoomOutline) 800)      │
│           910                HeatingUnitModel1                 │
│             ╲                HeatingUnitModel2))               │
│              ╲                                                 │
│               (let base (get 1i (LinesFromPolyline             │
│  RoomOutline)))                                                │
│                                                                │
│               (let tangent (LineTangent base))                 │
│               (let perp                                        │
│                       (TransformVector                         │
│                               tangent                          │
│                               (Rotate (Vector !0 !0 !1) !1.57)))│
│               (assert tabove0 (gte t !0))                      │
│               (assert tbelow1 (lte t !1))                      │
│               (let p                                           │
│                       (LineEval (get 1i (LinesFromPolyline     │
│  RoomOutline)) t))                                             │
│                                                                │
│               (let offset (VectorByDirectionLength perp d))    │
│               (let o (LineEnd (LineByStartSpan p offset)))     │
│           915                                                  │
│             ╲ (let placed                                      │
│               ╲ (Transform chosen (Orient o tangent perp)))    │
│                (let^ clearance (Distance placed RoomOutline))  │
│                (assert farEnoughFromWalls (gte clearance !2.0))│
│                (list p o placed)))                             │
│                                                                │
└────────────────────────────────────────────────────────────────┘
```

*FIG. 9*

SYSTEMS AND METHODS FOR GENERATING PROGRAMMATIC DESIGNS OF STRUCTURES

CROSS-REFERENCE TO RELATED APPLICATIONS

The current application claims the benefit of and priority under 35 U.S.C. § 119(e) to U.S. Provisional Patent Application No. 62/556,107 entitled "Systems and Methods for Generating Programmatic Designs of Structures" filed Sep. 8, 2017. The disclosure of U.S. Provisional Patent Application No. 62/556,107 is hereby incorporated by reference in its entirety for all purposes.

FIELD OF THE INVENTION

This invention relates to providing systems and methods to generate designs of structures using a programmatic approach and more particularly to using the programmatic expression of structure to present suitable products for design details.

BACKGROUND OF THE INVENTION

In traditional design workflows, architects and other designers manually layout the elements of a design, such as windows and ducts using a design tool, such as Autocad or Revit. Building Information Modeling (BIM) is a process involving the generation and management of digital representations of physical and functional characteristics of places. Building information models (BIMs) are files (often but not always in proprietary formats and containing proprietary data) which can be extracted, exchanged or networked to support decision-making regarding a building or other built asset.

SUMMARY OF THE INVENTION

Systems and methods for generating programmatic designs of structures in accordance with embodiments of the invention are illustrated. One embodiment includes a system for generating a programmatic description of a design of a structure, including a processing system, and a memory accessible by the processing system storing instructions that when read by the processing system direct the processing system to receive a visual description of a structure, identify features in the visual description of the structure, determine a list of candidate components corresponding to the identified features from the visual description of the structure, resolve parameters for each component in the list of candidate components, generate a programmatic description of the structure based on the list of candidate components of the resolved parameters and perform an error check to determine an amount that the programmatic description differs from the visual description.

In another embodiment, the visual description of the structure is a Building Information Model (BIM).

In a further embodiment, to determine a list of candidate components, the instructions further direct the processing system to select at least one candidate component from a catalog of pre-defined components.

In still another embodiment, the catalog of components includes information about each component, where the information is selected from the group consisting of cost per unit, component availability, component weight, and component dimensions.

In a still further embodiment, to determine a list of candidate components, the instructions further direct the processing system to identify a set of parameters that describe the feature, and locate a set of components in the catalog of components that corresponds to the set of parameters.

In yet another embodiment, the instructions further direct the processing system to receive an input describing the addition of at least one component to the programmatic design of the structure, and update the programmatic description of the building with the at least one component.

In a yet further embodiment, the instructions further direct the processing system to receive an updated visual description of the structure, identify updated features in the updated visual description of the structure, determine a second list of candidate components corresponding to the updated features, update the programmatic description of the structure with the updated features, and perform an error check to determine an amount that the updated programmatic description differs from the visual description.

In another additional embodiment, the processing system determines, for each feature, the list of candidate components corresponding to the identified features utilizing a separate processing thread.

In a further additional embodiment, the processing system is a distributed processing system.

In another embodiment again, the programmatic description of the structure includes a set of components that make up the structure, and each component in the set of components is assigned a unique identifier.

In a further embodiment again, a method for generating a programmatic description of a design of a structure includes receiving a visual description of a structure, identifying features in the visual description of the structure, determining a list of candidate components corresponding to the identified features from the visual description of the structure, resolving parameters for each component in the list of candidate components, generating a programmatic description of the structure based on the list of candidate components of the resolved parameters, and performing an error check to determine an amount that the programmatic description differs from the visual description.

In still yet another embodiment, the visual description of the structure is a Building Information Model (BIM).

In a still yet further embodiment, determining a list of candidate components further includes selecting at least one candidate component from a catalog of pre-defined components.

In still another additional embodiment, the catalog of components includes information about each component, where the information is selected from the group consisting of cost per unit, component availability, component weight, and component dimensions.

In a still further additional embodiment, determining a list of candidate components further includes identifying a set of parameters that describe the feature, and locating a set of components in the catalog of components that corresponds to the set of parameters.

In still another embodiment again, the method further includes receiving an input describing the addition of at least one component to the programmatic design of the structure, and updating the programmatic description of the building with the at least one component.

In a still further embodiment again, the method further includes receiving an updated visual description of the structure, identifying updated features in the updated visual description of the structure, determining a second list of candidate components corresponding to the updated features, updating the programmatic description of the structure with the updated features, and performing an error check to determine an amount that the updated programmatic description differs from the visual description.

In yet another additional embodiment, the method further includes determining, for each feature, the list of candidate components corresponding to the identified features utilizing a separate processing thread.

In a yet further additional embodiment, the method is performed using a distributed processing system.

In yet another embodiment again, the programmatic description of the structure includes a set of components that make up the structure, and wherein each component in the set of components is assigned a unique identifier.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

FIG. 8 illustrates a flow diagram of a process for adding a component to a structure in accordance with an embodiment of the invention.

FIG. 9 illustrates a programmatic language description of a component of a structure in accordance with an embodiment of the invention.

DETAILED DESCRIPTION OF THE INVENTION

Figure 1:
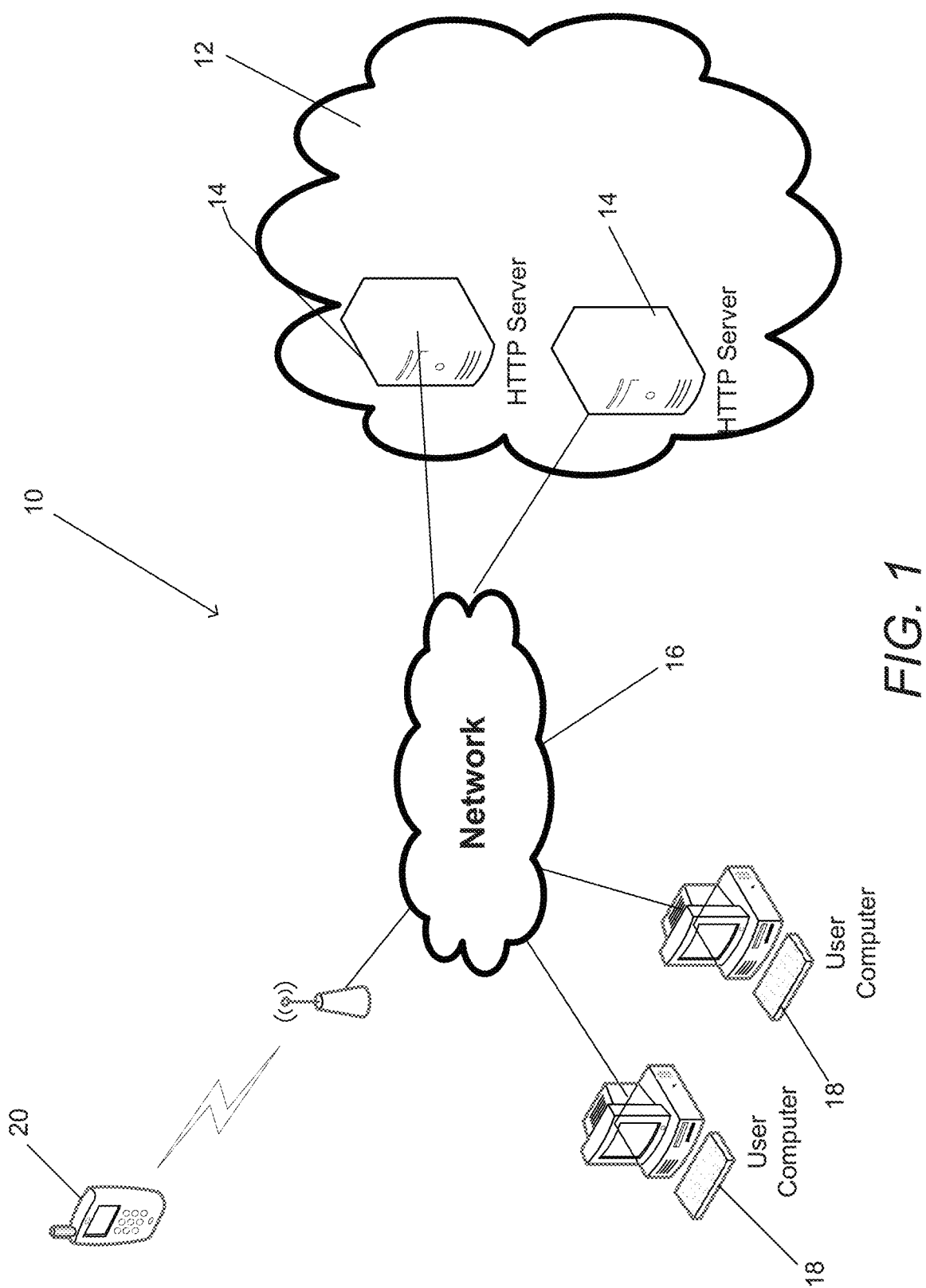
FIG. 1 illustrates a network including devices that generate programmatic designs of structures in accordance with an embodiment of the invention.

Turning now to the drawings, systems and methods for generating programmatic designs of structures are disclosed. System and methods for generating programmatic designs of structures in accordance with some embodiments of the invention may be referred to as reactive design modeling. In accordance with many embodiments, systems and methods that generate programmatic designs may serve as a bridge between a computational approach to design and the more traditional workflows for designing a structure. In numerous embodiments, generated programmatic descriptions of designs are represented as models, including, but not limited to, BIMs, and/or any other type of model as appropriate to the requirements of specific applications of embodiments of the invention.

In traditional design workflows, architects and other designers manually layout the elements of their designs such as windows and ducts using a conventional design tool such as Autocad or Revit. The manual layout of the design is labor-intensive, and these sorts of designs are very slow to iterate. In a computational workflow, instead of manually laying out all of the necessary elements, a designer writes program instructions to generate and/or modify the design and the system generates and/or modifies the design based on the instructions. This computational workflow can save huge amounts of effort on behalf of the designers and results in a programmatic description of the designed structure. One of the advantages of a programmatic approach to designing a structure is that much of the process of selecting, configuring and/or placing design elements can be reduced to higher-level logic. Another advantage is that components may be reduced to a set of instructions that can be compared to the parameters of manufacturing products to allow a designer to select a designer product for use in the component.

One potential disadvantage of programmatic design is that for the designers will need to learn to program in the design language and/or computer programming principles to work effectively using computational designs. To overcome the lack of programming knowledge by designers, systems and methods in accordance with some embodiments of the invention preserve the flexibility and power of a programming language while allowing designers to manipulate designs in the intuitive 2D & 3D environments by allowing a designer to design the structure in a visual environment similar to existing design products and converting the design to a programmatic description of the design. To do so, systems and methods in accordance with many embodiments of this invention can overcome at least the following four interrelated problems to allow designers to fluidly interact with programmatic content: creating new program structure based on user input, updating a program structure (for example, how to generate a reusable component from a sketched set of curves into a reusable component), assigning continuous parameters (how to determine positions of components in space), and assigning discrete parameters (determining which of two possible components should be included in the programmatic design).

To provide updates to a programmatic description of a structure, system and methods in accordance with many embodiments of the invention use refactoring tools. The assigning of continuous and discrete parameters are the greatest obstacles in manipulating architectural data. The assignment of these parameters are problematic because shapes of a building are largely defined by real numbers where all of the positions that define curves or plans in a design are continuous parameters. However, many choices in a design remain discrete because some components are only manufactured in particular sizes and cannot be obtained in arbitrary sizes. For example, lumber is only provided in set dimensions. For example, 2×4 and 1×6 are common dimensions, and others may not be available in a more desired size.

To assign continuous and discrete parameters, systems and methods for generating programmatic designs in accordance with some embodiments of this invention may use powerful number solving techniques to for assigning continuous parameters. To assign discrete parameters, systems and methods in accordance with many embodiments of the invention use dedicated geometric constraint solvers. The system and methods in accordance with several embodiments includes an engine sits in between the number solvers and the geometric constraint solvers; and mediates contentions between the solvers.

A more complete description of systems and methods for generating programmatic designs of a structure in accordance with various embodiments of the invention follows.

Network Environment

A network that includes user devices and systems that generate and use programmatic descriptions of structure designs in accordance with some embodiments of this invention is shown in FIG. 1. Network 10 includes communications network 16. Communications network 16 is a network such as the Internet that allows devices connected to network 16 to communicate with other connected devices. Each of one or more server systems 14 is connected to network 16. In accordance with some embodiments, two or more server system 14 communicate with one another over the network to form a cloud server system 12 to allow the servers 14 of cloud system 12 to perform processes of a provided system in a distributed manner. Those skilled in the art will recognize that while two servers are shown, any number of servers may be included in cloud server system 12. Furthermore, one or more database servers (not shown) may be communicatively connected to any one of servers 14 to store data including, but not limited to, programmatic descriptions of structures; programmatic descriptions of reusable components in structures; libraries used in the generating and/or using programmatic description of structures; and/or processes for generating and/or using the programmatic descriptions of structures.

Users interact with a system that generates and/or uses programmatic descriptions of designs using a device executing an application that communicates with processes performed by the system. Some examples of appropriate devices include, but are not limited to, devices 18 and 20 that connect to network 16. In the shown embodiment, personal device 18 is shown as a desktop computer that is connected via a conventional "wired" connection to network 16. However, personal device 18 may be a desktop computer, a laptop computer, a smart television, an entertainment gaming console, automobile infotainment system, and/or any other device that connects to network 16 via a "wired" connection. Mobile device 20 connects to network 16 using a wireless connection. A wireless connection is a connection that uses Radio Frequency (RF) signals, Infrared signals, or any other form of wireless signaling to connect to network 16. In FIG. 1, mobile device 20 is a mobile telephone. However, mobile device 20 may be a mobile phone, Personal Digital Assistant (PDA), a tablet, a smartphone, or any other type of device that connects to network 16 via wireless connection without departing from this invention.

Processing System

Figure 2:
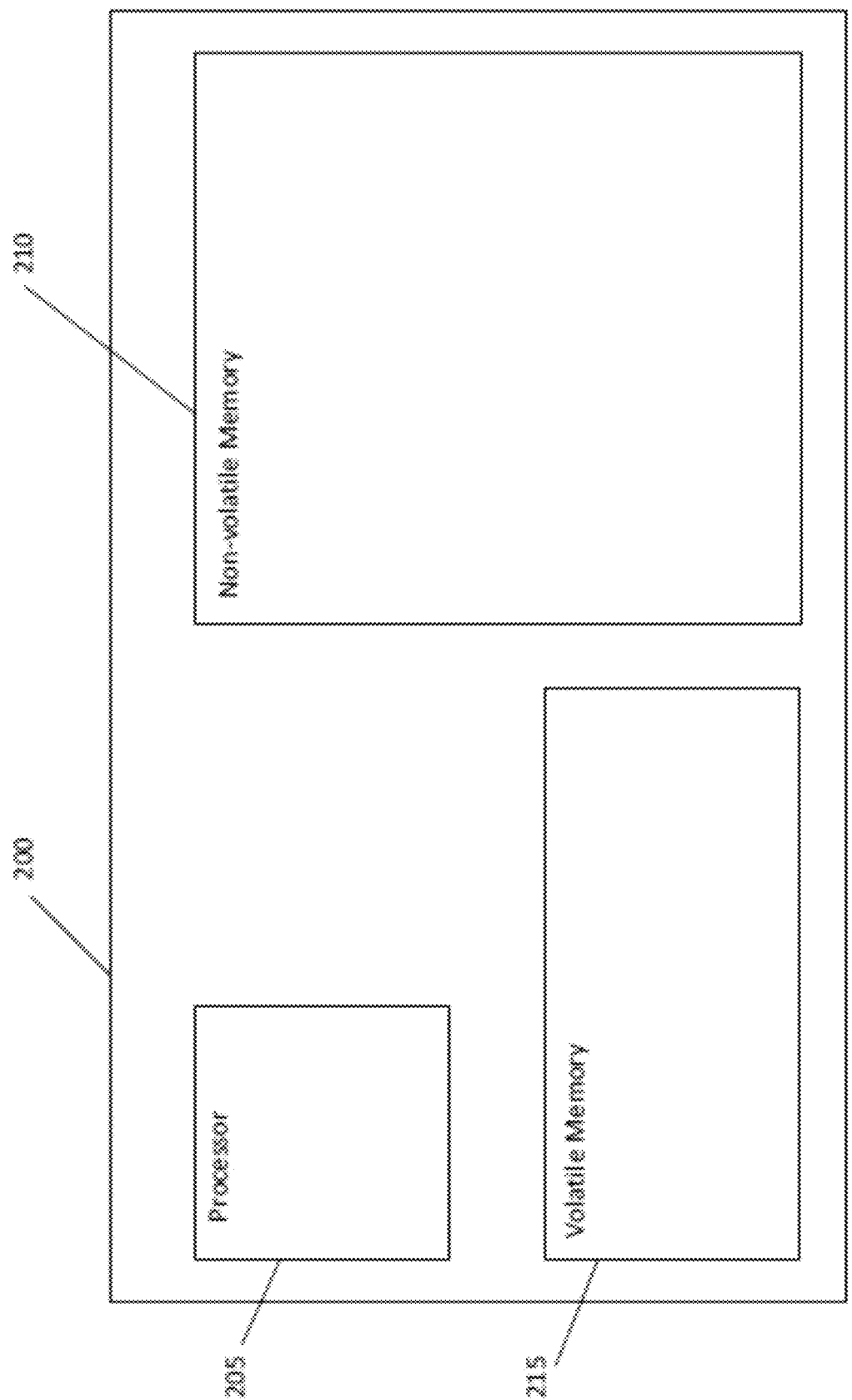
FIG. 2 illustrates a block diagram of components of a processing system of a device that generate programmatic designs of structures in accordance with an embodiment of the invention.

An example of a processing system that executes instructions to perform processes that provide applications, such as the processes that generate and/or use programmatic descriptions of structure designs in the devices shown in FIG. 1 in accordance with some embodiments of this invention is shown in FIG. 2. One skilled in the art will recognize that a particular processing system may include other components that are omitted for brevity without departing from this invention. The processing device 200 includes a processor 205, a non-volatile memory 210, and a volatile memory 215. The processor 205 is a processor, microprocessor, controller, or a combination of processors, microprocessor, and/or controllers that performs instructions stored in the volatile 215 or non-volatile memory 210 to manipulate data stored in the memory. The non-volatile memory 210 can store the processor instructions utilized to configure the processing system 200 to perform processes including processes in accordance with embodiments of the invention and/or data for the processes being utilized. In many embodiments, processor instructions are stored as a programmatic description generation application. In a variety of embodiments, the processing system software and/or firmware can be stored in any of a variety of non-transient computer readable media appropriate to a specific application. A network interface is a device that allows processing system 200 to transmit and receive data over a network based upon the instructions performed by processor 205. Although a processing system 200 is illustrated in FIG. 2, any of a variety of processing system in the various devices can be configure d to provide the methods and systems in accordance with embodiments of the invention.

Process for Generating Programmatic Description of a Design

In accordance with some embodiments of the invention, systems and methods generate programmatic descriptions of designs from visual representations of the design input by a designer using a visual environment similar to conventional design processes. An example of a programmatic description of a component in a structure is shown in FIG. 9. A programmatic description 900 includes a title portion 905, a heating unit decision section 910, a placement selection process 915 and a restriction requirement 920. The heating unit decision portion 910 chooses the model of the heating unit to use based on the size of the room. The placement process 915 determines a place to place the heating unit in the based upon placement parameter t and d. The restriction requirement 920 places restrictions on where the unit may be placed. For example, the restriction requirement 920 specifies that the heating unit must be placed at least 2 feet away from the walls of the room for maintenance purposes. In numerous embodiments, a component can be a particular structure element (e.g. a window, a column, a wall, a pipe, or any other structure element that could be used in a structure) and/or a guide marker for placement of additional components. For example, an "abstract" guide marker component can be a point or area represented in the description of the structure that indicates the placement of a "physical" component that would be a part of the constructed building (e.g. a window, etc.).

Figure 3:
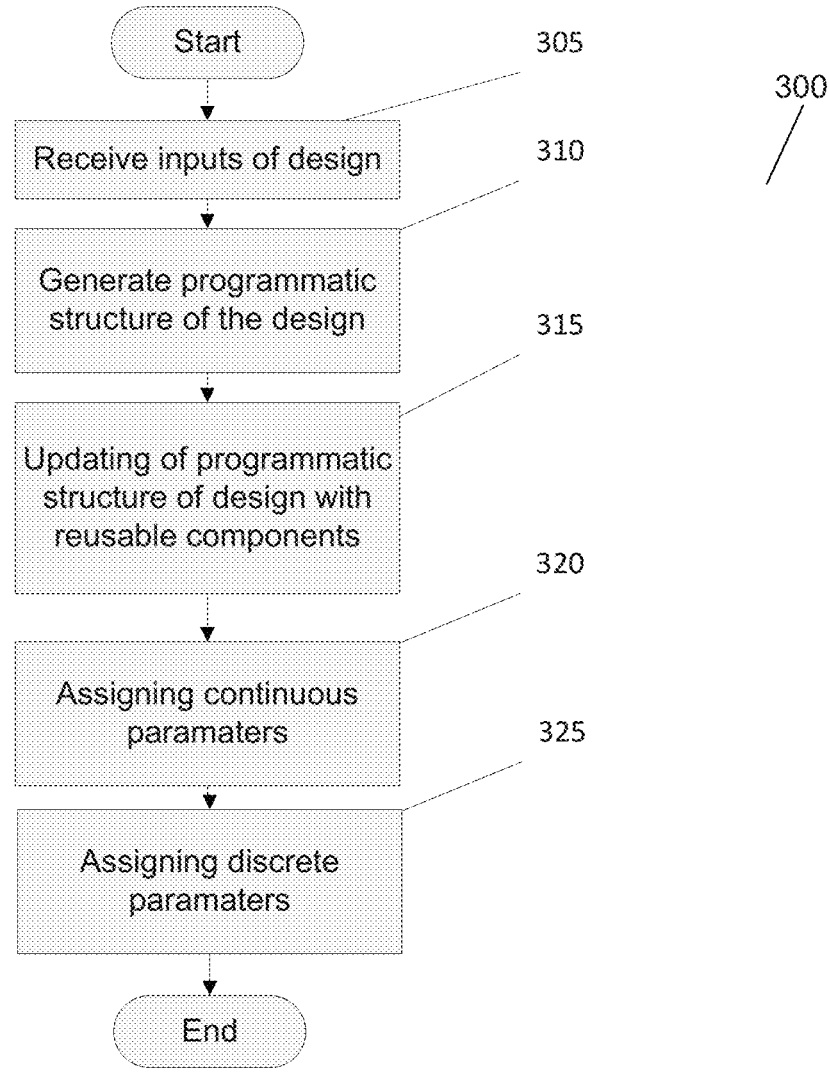
FIG. 3 illustrates a flow diagram of a process for receiving visual input and generating a programmatic description of a structure in accordance with an embodiment of the invention.

A process for receiving visual input and generating a programmatic description of a structure in accordance with an embodiment of the invention is shown in FIG. 3. A process 300 generates the programmatic description of a structure based on a visual input. The process 300 receives an input of a visual representation of a structure (305). The visual representation is translated into a programmatic description of the structure (310). The programmatic description of the structure is determined by a programming language that includes a certain syntax and other rules based upon advances in program synthesis research. The process 300 may also receive updates to the visual description and/or descriptions of reusable components in a visual context and can update the programmatic description of the structure with the updates and/or reusable components (315). Continuous parameters are assigned in the programmatic description of the structure based on the input visual description (320) and discrete parameters are assigned in the programmatic description (325) based on the visual description. Although a process for generating a programmatic description of structure design in accordance with an embodiment of the invention is described above with reference to FIG. 3, other processes for generating programmatic descriptions of structure designs based on the requirements of other systems in accordance with other embodiments of the invention are possible.

Figure 4:
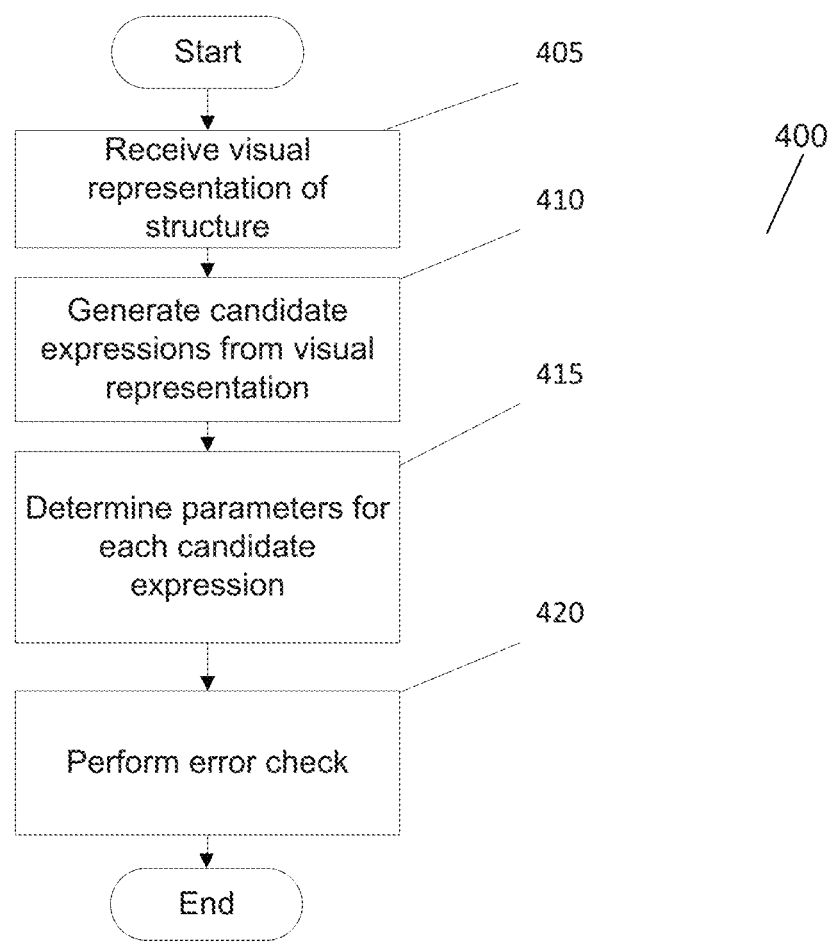
FIG. 4 illustrates a flow diagram of a process for performing the translation of the visual representation to a programmatic design structure in accordance with an embodiment of the invention.

Based on desired parameters, the rest of the visual representation and a library of functions for the programming language and a library of functions for the particular model, a process for translating an input visual representation of the structure into a programmatic description of the structure performs the translation. A flow diagram of a process for performing the translation of the visual representation to a programmatic description for a design of a structure in accordance with an embodiment of the invention is shown in FIG. 4.

The process 400 receives a visual representation of the structure (405). The process reads the visual representation and generates candidate expressions (410). The generation of candidate expressions can be performed by searching for known structure components in the visual representation to generate a list of candidate expressions. In accordance with the some embodiments, the candidates may be determined by searching the visual representation for existing defined components that are added to a list of candidate expressions. In accordance with many embodiments, a recursive process can be called that iterates through all of the components defined in the library of the language and/or the library of defined components for the particular structure to search for each of the existing defined components in the visual description. For each component in the list of candidates, the same process is recursively performed. In accordance with a number of embodiments, the number of recursions may be bound by a maximum number. The maximum number can be set so that the process scales efficiently in accordance with a few embodiments of the invention.

The process 400 attempts to determine the parameters for each component in the list of candidate expressions (415). In accordance with some embodiments, one or more attempts may be made to determine the parameters for a component and if the parameters for the component cannot be determined in the defined number of attempts, the process 400 leave the parameters for the component unresolved. The process 400 can also perform an error check (420). The error check determines how much the resulting programmatic description of the structure varies from the visual representation. If the programmatic description varies too much from the visual representation, the process makes a second attempt by re-starting either at the beginning of the process or at some intermediate point.

In accordance with some embodiments, the process may determine whether a visual representation is too large and/or has too many degrees of freedom. If so, the process, does not attempt to translate the visual representation to a programmatic description. In accordance with several embodiments, the process may be biased to using components in the structure that have already been identified by the process in attempting to determine a new component. For example, the process may infer that a line is drawn to the surface such as previously determined floor or wall instead of a position in space. In accordance with a few embodiments, the process may use adjacency restraints to help determine the programmatic description from the visual representation. The adjacency restraints uses an older description of the same structure and generates a set of descriptions of various layouts. The descriptions of various layouts may be compared to a programmatic description of the older description and a best fitting layout may be selected. In accordance with a number of embodiments, the process may resolve pathfinding problems. Pathfinding problems are largely intractable due to the number of possibilities. For example, the problem that a fire exit within a certain distance of each room in a structure. Furthermore, systems in accordance with various embodiments of the invention may reason about and solve other complex configuration problems including, but not limited to, the options encoded in manufacturer' design codes and/or the complicated logic of building codes.

Although the above describes various embodiments of a process for performing the translation of the visual representation to a programmatic design structure. Other embodiments that add, remove, and/or combine steps may be implemented based on particular system requirements in accordance with various other embodiments of the invention.

Sometimes users want to modify a design of a structure by interacting with the visual representation of the structure. As such, systems in accordance with some embodiments of the invention provide processes for receiving a modification and generating a programmatic description of the modification to add and/or modify the programmatic instruction of the design. A flow diagram of a process for modifying a programmatic description of the design based on user interactions with a visual representation in accordance with an embodiment of the invention is shown in FIG. 8.

A process 800 receives inputs of user interactions with the visual representation (805). In many embodiments, the user interactions are through a graphical user interface. In some embodiments, user interactions are entered as text. User interactions can be entered by manipulating a visual representation of the structure by adding or removing components. However, user actions can be any recordable action that manipulates the design of the structure. The process 800 synthesizes selection criteria from the input information (810). The selection criteria may indicate where the input component(s) may be placed within the structure. In accordance with many embodiments, the synthesizing of the placement criteria may also include generating and/or updating a programmatic description of the component being added and/or modified. The selection criteria can be used to incorporate the programmatic description of the component into the programmatic description of the design (815). The process may generate a rendering of the design from the programmatic description with the added and/or modified component (820). The rendered design may then be checked against any rules and/or restrictions to determine whether the rules and/or restrictions are violated by the rendered structure (825). If there is a rule violation, the process 800 may be repeated from the synthesizing of selection criteria (810) to generate a new programmatic description of the added and/or modified component that complies with the rules and/or restrictions. Otherwise, the process 800 has successfully added the new and/or modified component to the programmatic description of the structure.

The following are two examples of adding and/or modifying components with a design of a structure in accordance with an embodiment of the invention. In the first example, a user want to assign a pane of a window to be active. To do so, the user specifies how to place the window in the model by interacting with the visual description of the design of the structure. The system infers a programmatic description of the pane of the window from the user interactions. In this example, the system may generate the following programmatic descriptions: "just this specific panel", "all panels on the third floor", and "all panels directly in front of a structural column". The system then selects the appropriate programmatic description, instantiates the component, adds the component to the design, and redraws the design. The system may then check to determine whether any rules and/or restrictions of the model are violated by the addition of the window. If so, the system may either report the violations to the user to allow the user to fix and/or process modifies the description of the window to satisfy the rules and/or restrictions.

In a second example, a user selects a vertical member of a curtain wall on a particular floor and moves the member to the left in the design. From this move, the system may infer that the entire curtain wall is to be moved because the vertical member is a component within a component (a curtain wall) and the rules of the component (curtain wall) of which the vertical member is a component require that all members of the component must move together. Based upon the movement of the one vertical member, the system may infer the appropriate parameters of the curtain wall to update to move the curtain wall to the desired position within the design. The system may then redraw the updated design. The system may then perform a rule and/or restrictions check and determine that several of the vertical members support the required wind load. Based on the description of the particular manufacturer of the vertical panels, the system may determine that this problem may be overcome by inserting steel bars to reinforce the wind load and instantiates these steel bars appropriately.

To generate the programmatic description from the visual representation, systems and methods in accordance with some embodiments of the invention need to perform "angelic execution" of program traces that determines the set of inputs to a program that generate a desired output. In accordance with many embodiments of the invention, the programmatic description is generated using a hybrid problem resolver that combines numerical hill-climbing and aggressive partial function inversion as described below.

To describe the hybrid problem resolver in accordance with many embodiments the following example is used. The example problem includes a series of nested function calls (Func1, Func2, Func3) on undefined variables (a, b, c, and d), and a desired result (1.0). It should be noted, the examples is simple and limited to simple a numeric examples. However, the data described by a hybrid problem resolver in accordance with some embodiments of the invention can be arbitrary (e.g., points, curves, solid bodies).

To solve the problem, the hybrid problem resolver in accordance with some embodiments of the invention needs to find assignments for the undefined variables such that this equality holds:

Func1(Func2($a,b$),Func3($c,d$))=1.0

In the example, the hybrid problem resolver may have a few other pieces of information about the problem including, but not limited to, initial guesses for the undefined variables, and inversions for some of the functions. Inversions of a function take an output of the underlying function and exactly and efficiently produce a set function arguments that create the desired output if evaluated in the function.

Naively, a problem resolver in accordance with some embodiments of the invention may apply the entire problem into a numerical solver. The numerical solver hill-climbs to a solution. However, hill-climb approach is a slow process because an entire problem often has many undefined variables and evaluating the entire problem inside of the core loop of the numeric solver is computationally expensive.

Figure 5:
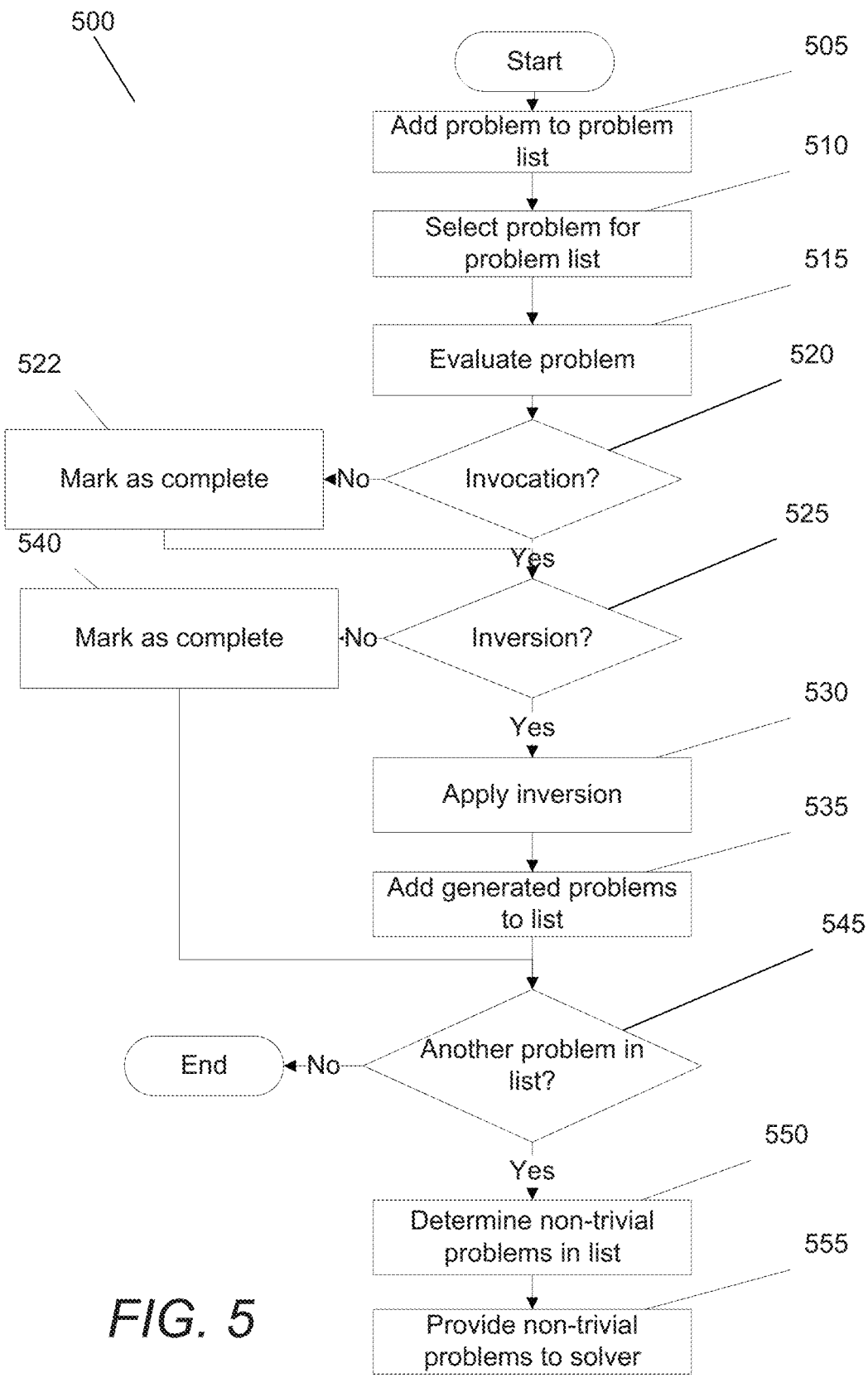
FIG. 5 illustrates a flow diagram of a hybrid process for recursively solving for a problem in accordance with an embodiment of the invention.

To reduce the computational expense, a hybrid problem resolver in accordance with some embodiments of the invention recursively reduces a problem into smaller sub-problem. Each sub-problem may be evaluated in turn. A flow diagram of a hybrid process for recursively solving for a problem in accordance with an embodiment of the invention is shown in FIG. 5.

The process 500 begins with a problem list that includes the problem to be resolved (505). The process selects a problem from the list (510) and evaluates the problem (515). If the process 500 determines the problem is not a function invocation (520), the process 500 marks the problem complete (522) and continues. The process determines whether an inversion exists for the problem (525). If an inversion does exist, the process applies the inversion (530). The application of the inversion generates sub-problems that are added to the problem list (535). If an inversion does not exist, the process marks the problem as complete (540) moves on to the next problem (545). In moving to the next problem, the process 500 evaluates the problems in the problem list and determines each problem that is a non-trivial problem (550) and provides the determined non-trivial problems to a numerical solver (555).

Applying the process described in relation to FIG. 5 to the example problem described above with the additional facts that the inversions for Func1 and Func2 are Func1' and Func2', respectively, the process is performed in the following manner.

First, Func1' to the desired output:

Func1'(1.0)→(0.5,2.0)

The application of the inversion of func1 generates the following new problems that are added to the problem list:

Func2($a,b$)=0.5

Func3($c,d$)=2.0

The process then applies the inversion of func2:

Func2'(0.5)→(3.0,4.0)

The application of inversion of Fun2 generates the following problems that are added to the problem list:

Func3($c,d$)=2.0;

a=3.0;

b=4.0;

In the example problem given, Func3 does not have an inversion, and the final two problems are not function invocations, so the process terminates. However, the problem list still includes two trivial problems (a=3.0 and b=4.0), and one much smaller sub-problem that we can pass into the numeric solver.

In accordance with a number of embodiments, the process may be extended in the following manner: instead of admitting only inversions that exactly invert functions, the process can accept inversions that re-express a function invocation in terms of a partial argument assignment and constraints on other arguments. Furthermore, processes in accordance with several embodiments may also accumulate constraints instead of only sub-problems. The constraints can be applied to the numeric solver to guide the solver in determining solutions. The use of the constraints may be shown using the following example:

Func1(a,Func2(b,c),Func3(b,c,d))=4.0

In the second example, the symbol inversion Func1", is the only inversion available and is expressed as follows:

Func1"(4.0)→(_,_,4.0),(a+Func2(b,c)=3.0)

The above inversion of Func1 is partial because the inversion does not generate assignments for the first two arguments, only the third. However, the process may accumulate the additional constraint (a+Func2(b, c)=3.0). Later, the constraint may be used by a numerical solver when evaluating the remaining sub-problem, Func3(b, c, d)=4.0).

Although a hybrid process for solving problems in accordance with various embodiments of the invention are discussed above with respect to FIG. 5, other processes for solving problems that add, remove, and/or combine steps of the above describe process that meet various system requirements are possible in accordance with some other embodiments of the invention.

Figure 6:
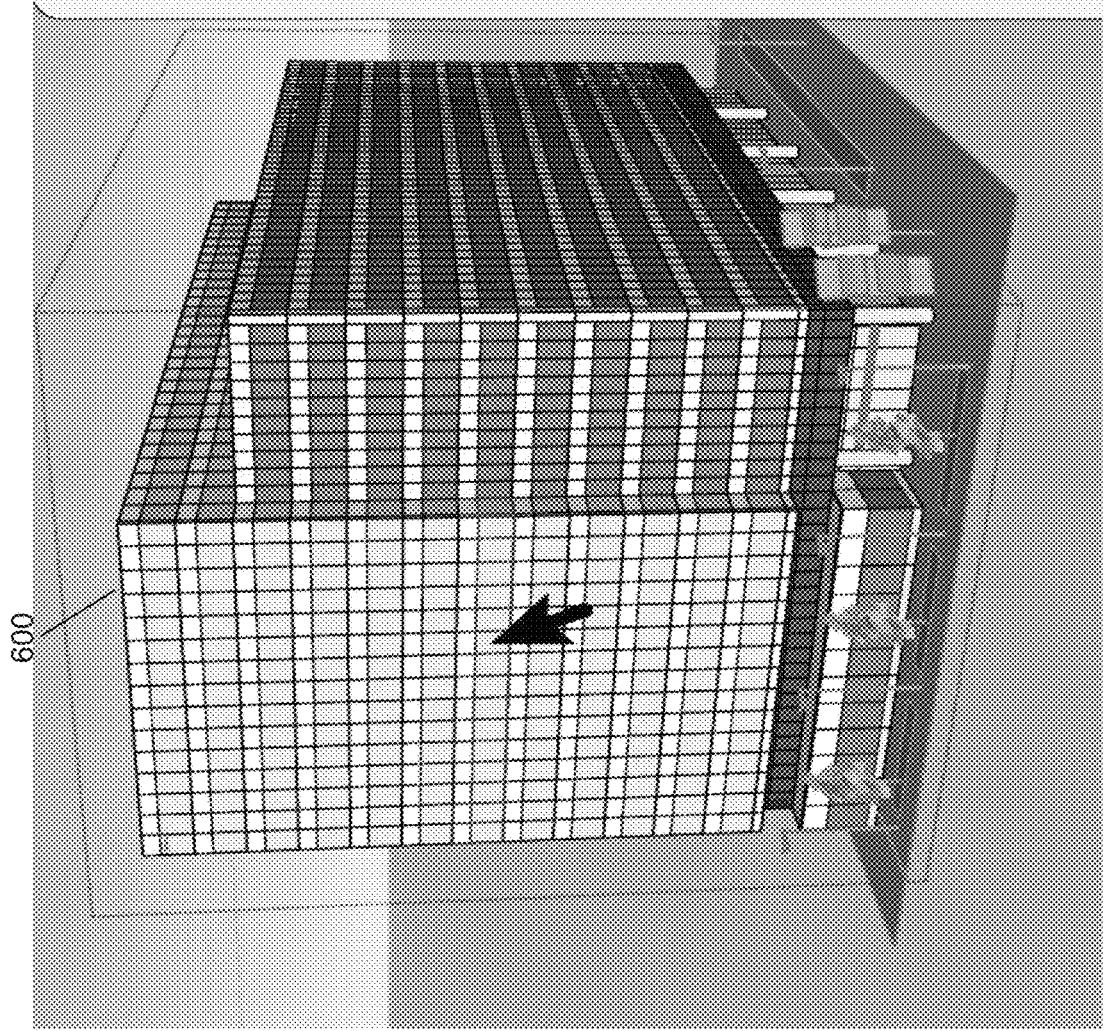
FIG. 6 illustrates a conceptual display of a provision products based on programmatic descriptions of the product and a structure design in accordance with an embodiment of the invention.
Figure 7:
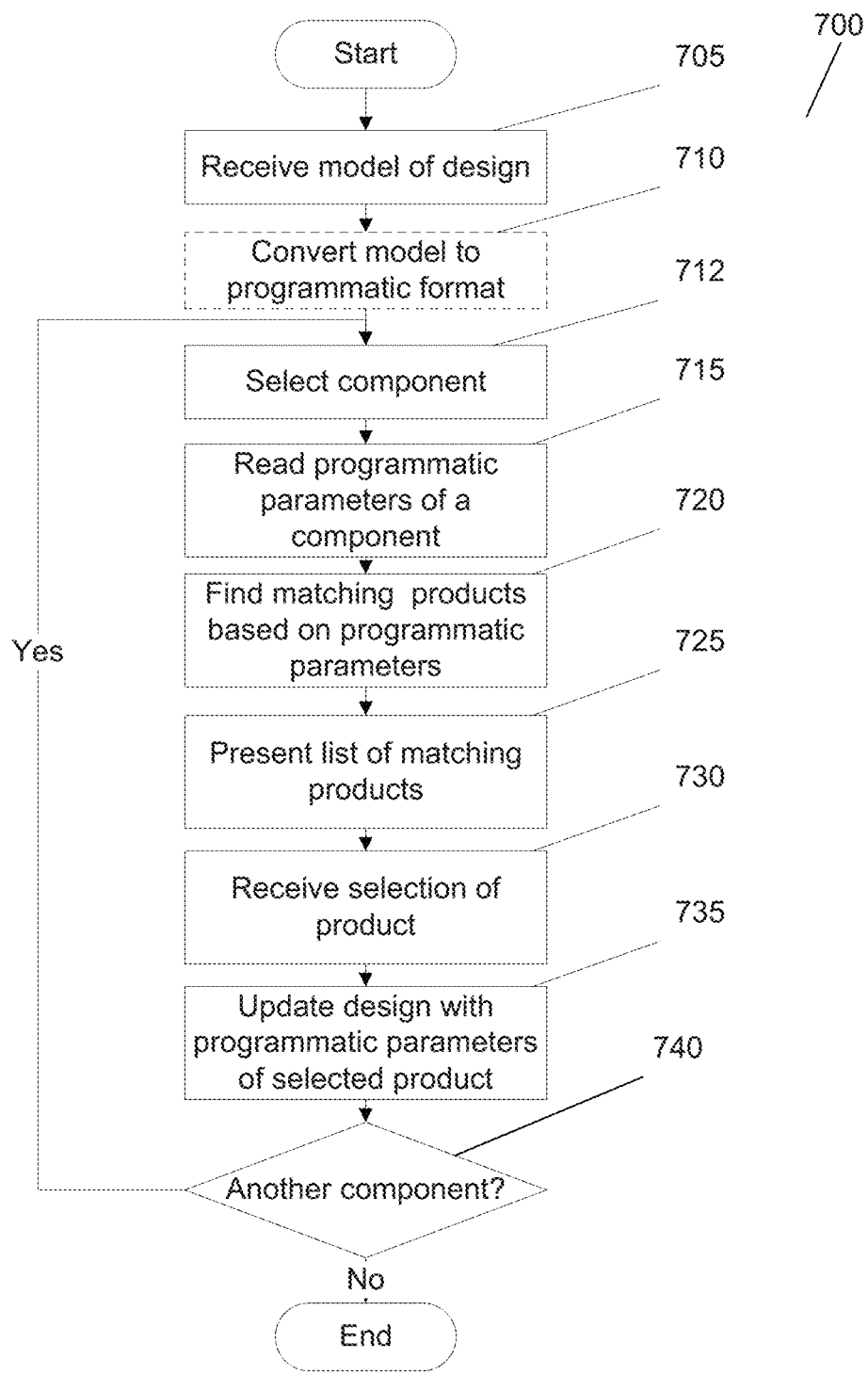
FIG. 7 illustrates a flow diagram of a process for providing products for use in a structure and/or integrating the product into a programmatic description of the structure in accordance with an embodiment of the invention.

Process for Recommending Products Based Upon Programmatic Descriptions of a Structure In accordance with some embodiments of the invention, the programmatic description of the structure can be used to recommend products for use in component of the structure. In accordance with many embodiments, a list of one or more alternative products for use in a component of a structure may be presented to the user. A conceptual display of a provision products in accordance with an embodiment of the invention is shown in FIG. 6 where a glass building 600 is shown and a list 615 of windows that may be used in the building are shown. The user may then select one or more of the products for use. The system may then integrate the programmatic description of each selected product into the programmatic selection of the structure. A process for providing products for use in a structure and/or integrating the product into a programmatic description of the structure in accordance with an embodiment of the invention is shown in FIG. 7.

A process 700 receives a representation of the structure (705). In accordance with some embodiments, the representation may be a programmatic description of the structure. In accordance with many of embodiments, the representation of the structure may be a visual representation of the structure. In accordance with a few embodiments, the representation may be made in any known manner.

If the representation is a visual representation and/or some other known type of representation, the process 700 may optionally translate the received representation of the structure into a programmatic description of the structure (710). In accordance with some embodiments, the translation may be performed in accordance with the processes described above.

From the programmatic description of the structure, the process 700 selects a programmatic description of a component (712). For example, the process may select a window. The programmatic description of the component is read (715) and used to search programmatic descriptions of products offered by one or more manufacturers (720). In accordance with some embodiments, other information in the programmatic description including, but not limited to, metadata that describes other properties of the structure. Examples of the other properties include, but are not limited to, a geographic location of the structures, builder's specification, and code requirements that may also be used to compare the programmatic information of the products to determine products that satisfy the requirements of a particular component. In accordance with some embodiments, the programmatic descriptions of the components can be stored in a library in memory that can be accessed to retrieve the descriptions for use. In accordance with a number of embodiments, the programmatic descriptions of the products are generated by encoding processes that receive the conventional descriptions of the products and generate the programmatic descriptions of the products. In a number of embodiments, the manufacturers may provide the programmatic descriptions of the products for storage in the library. The system may also include cataloging and indexing processes for maintaining the library in accordance with a several embodiments of the invention.

The process then generates a list of products that satisfy the requirements of the component (725). The list of products may include information about the products including, but not limited to, cost per unit, availability, weight, dimension, and/or installation time in accordance with many embodiments. In accordance with a number of embodiments, the process may determine a key parameter or set of parameters of the component and/or structure that is preventing a match with products when no or only less than a predetermined number of products are found to satisfy the requirements of the component.

The process receives an input of a selection of a product from the list for use in the component (730). The programmatic information for the selected product may be inserted into the programmatic information of the structure (735). In accordance with some embodiments, the programmatic information of the product may replace the programmatic description of the component. In accordance with many embodiments, the programmatic information may be added to a section of the programmatic description that lists the information of all products to be used in the structure. The process may then repeat the process for another component until all of the components in the programmatic description of the structure have be searched (740).

Although various embodiments of a process for providing and/or inserting products for components in a structure are described above. Other processes for providing and/or inserting products in accordance with various other embodiments of the invention may be used to satisfy particular requirements of particular systems.

Modifying Programmatic Designs

In many situations, it can be beneficial to be able to change the parameters of a programmatic description of a structure after the model has already been generated. However, in many conventional systems, changing parameters requires a complete or nearly complete regeneration of the model. Systems and methods for programmatic descriptions of designs enable the manipulation of parameters with accelerated regeneration of the model in a variety of ways, including, but not limited to, creating stable component identifiers, utilizing regenerator system architecture, and/or leveraging parallelizable code modules.

In many conventional systems, each component (e.g. a window, a column, or any other design element that may be utilized in a description of a building) is assigned an identifier (ID). Typically these identifiers are assigned at random each time the model is generated. However, building models can serve many needs and many parties over the lifecycle of a construction project. As such, it can be useful to have unique IDs for each component in a design, as information associated with a particular component can be maintained across users.

In numerous embodiments, processes for generating programmatic descriptions of structure designs assign unique identifiers to each component in a model. Unique IDs can be generated in a number of ways, including, but not limited to, making compound keys from metadata regarding the object (e.g. floor number+item type+$n^{th}$ component placed+the unique ID of the component upon which the current component is placed+a unique feature identifier, or any other set or ordering of metadata), as a unique static integer, or any other key generation method as appropriate to the requirements of specific applications of embodiments of the invention. In some embodiments, compound keys are tuples, hashes of tuples, and/or concatenated variables stored as a single data structure (e.g. an integer, a string, etc.). However, any format of key can be utilized as appropriate to the requirements of specific applications of embodiments of the invention. Unique IDs can be stably generated from at least some of the parameters that describe the component. Unique IDs can persist between different runs of the program. In some embodiments, unique IDs persist by tracking removed or added component, by selecting a compound key which results in unique keys for each iteration, or any other tracking method as appropriate to the requirements of specific applications of embodiments of the invention. By using unique IDs, an individual component can be identified across multiple iterations of a model.

Processes for generating programmatic descriptions of structure designs can further include regenerator processes. Regenerator processes can utilize regenerator system architecture to accelerate the regeneration of models where parameters have been modified. In many embodiments, regeneration processes involve identifying which features are being modified. "Features" refers to a class of components, for example, all windows, all doors, all pipes, etc. However, features can be as coarse or granular as appropriate to the requirements of specific applications of embodiments of the invention. For example, a feature may be all external windows, all stairwell doors, all copper U-pipes etc. Regeneration processes can further determine which features which are not explicitly modified by a change in parameters will need to be updated based on which features are explicitly updated ("dependent features"). In numerous embodiments, only explicitly modified features and dependent features are updated which can reduce overall computation time by removing the need to regenerate the entire description.

Figure 10:
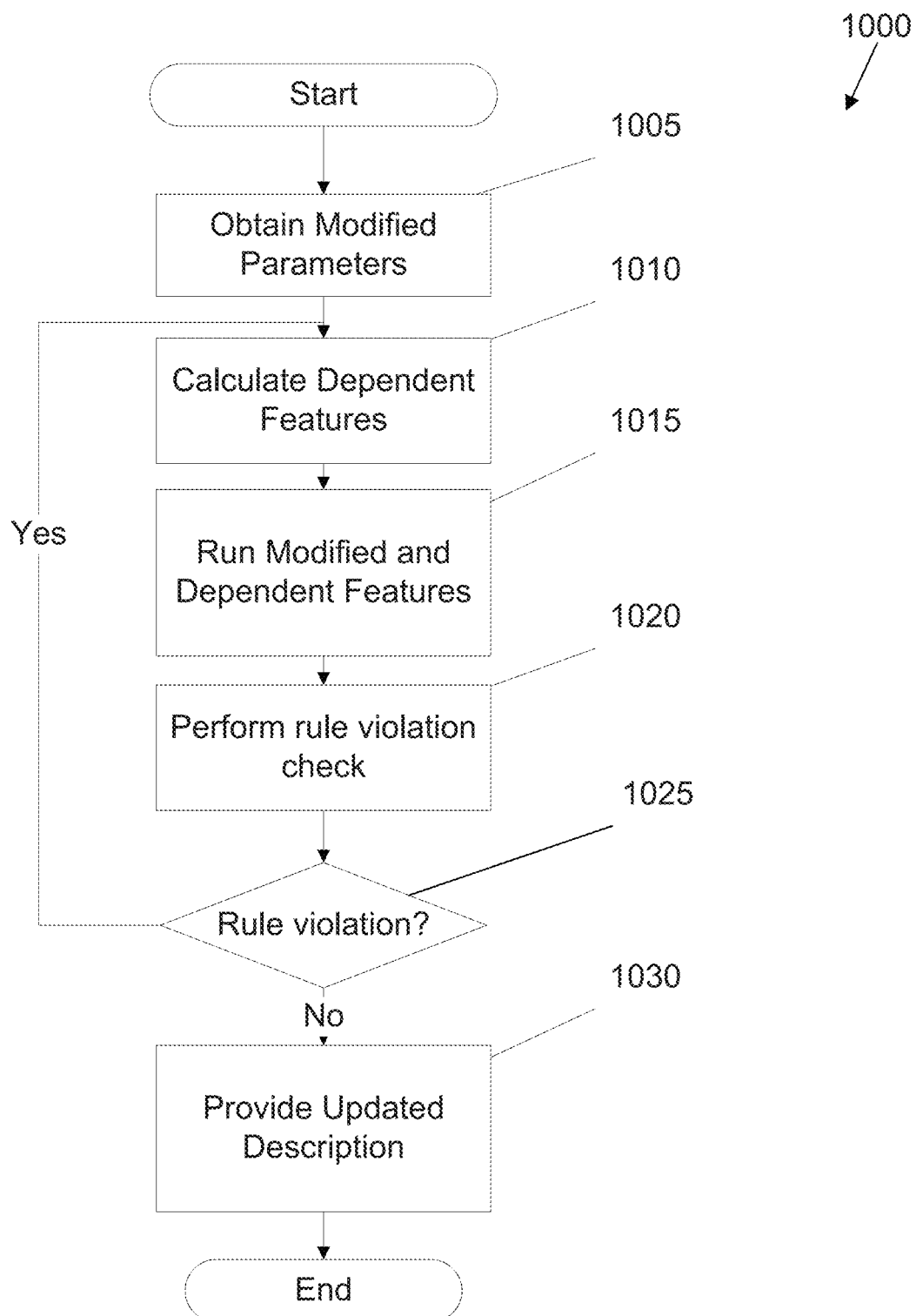
FIG. 10 illustrates a flow diagram of a process for updating programmatic descriptions of a structure in accordance with an embodiment of the invention.

Turning now to FIG. 10, a regenerator process in accordance with an embodiment of the invention is illustrated. Process 1000 includes obtaining (1005) modified parameters. In numerous embodiments, modified parameters are obtained using methods similar to those described above. In many embodiments, parameters are modified by manipulating a visual representation of the description. In a variety of embodiments, the parameters are modified via a text based user interface. However any of a number of different methods can be used to obtain modified parameters as appropriate to the requirements of specific applications of embodiments of the invention. Modified parameters may describe changes to a particular component (associated with a unique ID), a feature, or a combination of both.

In many embodiments, obtained modified parameters are associated with at least one feature. These components associated with the at least one feature can be explicitly modified by the modifications in the parameters. Process 1000 further includes calculating dependent features. In numerous embodiments, dependent features are calculated by traversing a dependency graph, where each node represents a feature and/or component, and each edge represents dependency. Dependency graphs can include unique component IDs, parameters, or any other information as appropriate to the requirements of specific applications of embodiments of the invention.

Process 1000 further includes running modified and dependent features. In numerous embodiments, running a feature involves placing each component associated with that feature using methods similar to those described above. In a variety of embodiments, features are run in a "top-down" ordering. For example, windows are placed prior to window shades. However, any number of orderings, including bottom-up orderings, can be used as appropriate to the requirements of specific applications of embodiments of the invention. In a number of embodiments, a rule violation check is performed (1020) to confirm that the description is sound. Rules violations can include, but are not limited to, overlapping components, structural integrity problems, building code violations, physically impossible structures, violation of a user-defined preference, or the violation of any other type of rules as appropriate to the requirements of specific applications of embodiments of the invention. If there is a rule violation (1025), dependent features can be recalculated, otherwise the updated description can be provided (1030). However, in numerous embodiments, rule violations can be responded to in any of a number of different ways, including, but not limited to, flagging a user to the rule violation, deleting conflicting components, or any other appropriate response either alone, or in combination with others. An example system architecture for features which can be utilized in running regenerator processes is described in FIG. 11.

As can be readily appreciated, any number of system architectures for features can be used for performing processes for generating programmatic designs of structures. However, for illustrative purposes, specific system architectures for features that can be utilized in systems for generating programmatic designs of structures have been provided as examples.

Figure 11:
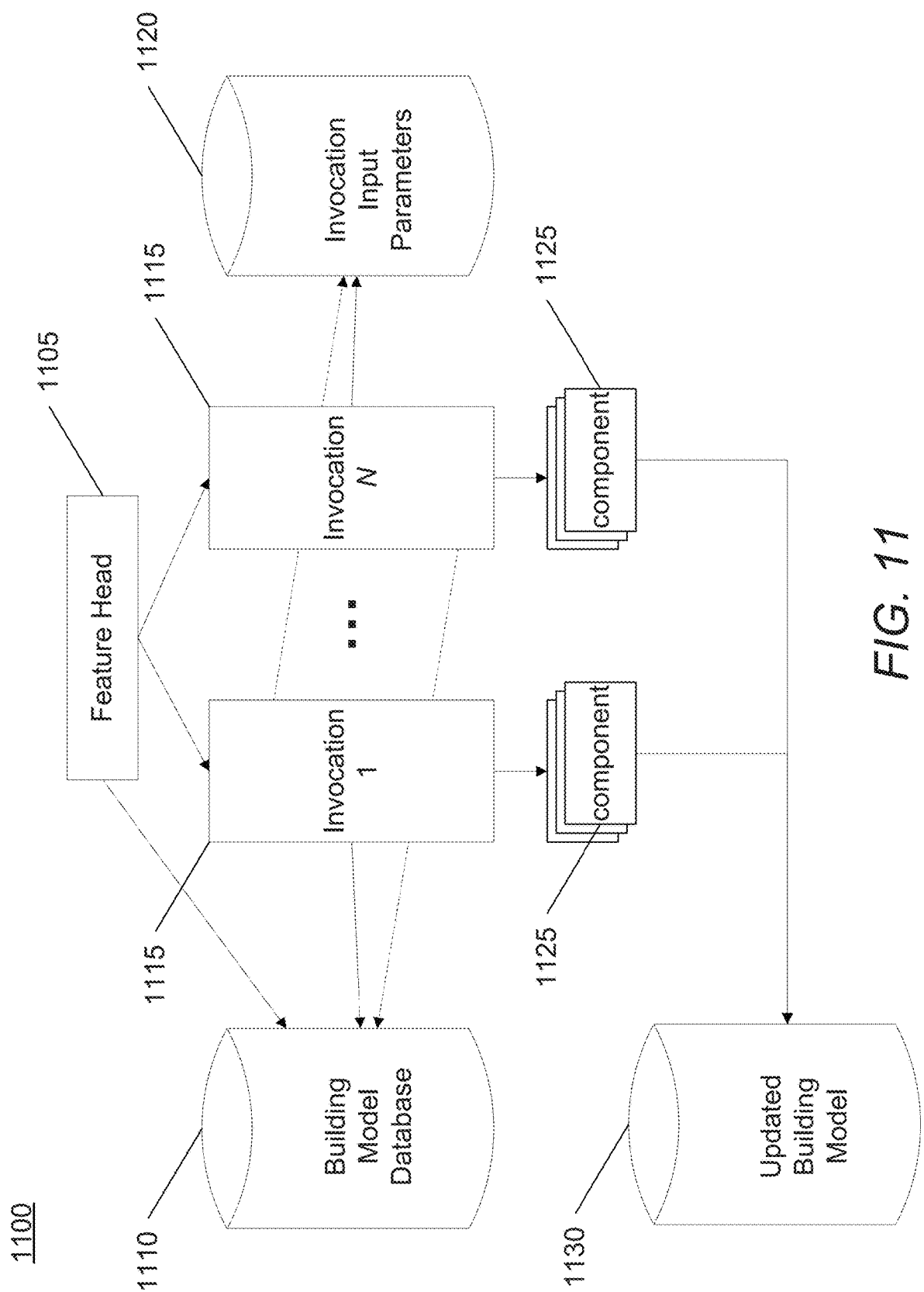
FIG. 11 is a conceptual illustration of a system architecture for generating programmatic descriptions of a structure in accordance with an embodiment of the invention.

Turning now to FIG. 11, a system architecture for a feature is illustrated in accordance with an embodiment of the invention is illustrated. In numerous embodiments, each feature is associated with a particular subroutine responsible for placement and/or management of a particular set of associated components. Feature 1100 includes a feature head 1105. Feature heads can be a data structure comprising a query that can be evaluated to generate and/or retrieve identifying information for each component associated with the feature. Features can be "invoked" more than once to create different sets of components that can have different parameters. For example, a "window" feature may be invoked twice to result in two different sets of windows (e.g. exterior windows and interior windows). In various embodiments, there can be multiple different features for the same class of component (e.g. Window type A, Window type B, etc.). In many embodiments, different types of components that fall within the same structural class are represented under a single feature which can be modified by input parameters.

In some embodiments, features can be invoked 1115 more than once to create different sets of components 1125 that can have identical parameters. In numerous embodiments, features can be invoked to generate a single component. Indeed, features can have multiple invocations, each of which produces a single, identical component. In a variety of embodiments, invocations produce different numbers of components.

Invocations can involve obtaining data from a building model database 1110 to extract information about how a component should be placed relative to other components. For example, the placement of a sunshade may be dependent upon the location of a window, so for placement of the sunshade, a query can be made as to the location of a given window. However any number of queries can be run as needed. In many embodiments, building model databases store programmatic designs of structures including, but not limited to, previous iterations of a given programmatic design, partial programmatic designs that are in the process or generation, or any other information as appropriate to the requirements of a given embodiment. Further, queries can be made to receive invocation input parameters. Invocation input parameters 1120 can be set by a user for a given feature, and can be any metadata that describes a component or feature, such as, but not limited to, color, dimensions, orientation, etc. Invocation input parameters can be continuously updated to regenerate programmatic designs of structures.

Sets of components 1125 can be a list of tuples that contain the unique ID of the component, the identity of the particular feature, parameters describing the component, or any other information as appropriate to the requirements of an application of a given embodiment. In many embodiments, sets of components contain only one component. Sets of components can be passed to updated building model 1130. Updated building model 1130 can represent the current state of the programmatic design of the structure incorporating the newly generated components using processes similar to those described above. In some embodiments, information from the updated building model is passed to the building model database.

In many embodiments, feature systems are repeated times for each feature in a programmatic design of a structure. Different instances of feature systems can share different data structures. For example, the updated building model and building model database can persistent across different instances. In this way, generation of features can be parallelized on different \s in one or more computing environments. In a variety of embodiments, different instances of feature systems are processed according to a dependency graph. In a variety of embodiments, regeneration of a programmatic design of a structure can be achieved by only running instances of feature systems that need to be updated as determined by the dependency graph. This can reduce the need to regenerate the entire design.

Although the present invention has been described in certain specific aspects, many additional modifications and variations would be apparent to those skilled in the art. It is therefore to be understood that the present invention may be practiced otherwise than specifically described, including various changes in the implementation without departing from the scope and spirit of the present invention. Thus, embodiments of the present invention should be considered in all respects as illustrative and not restrictive.

What is claimed is:

1. A system for generating a programmatic description of a design of a structure, comprising:
   a processing system; and
   a memory accessible by the processing system storing instructions that when read by the processing system direct the processing system to:
   receive a building information model (BIM);
   identify features in the BIM;
   determine a list of candidate components corresponding to the identified features from the BIM;
   resolve parameters for each component in the list of candidate components;
   generate a programmatic description of the structure based on the list of candidate components of the resolved parameters;
   receive a first updated BIM;
   identify updated features in the first updated BIM;
   determine a second list of candidate components corresponding to the updated features;
   update the programmatic description of the structure based on the second list of candidate components;
   perform an error check to determine whether a rule in a plurality of rules for the structure has been violated using the programmatic description;
   construct a third list of candidate components based on the second list of candidate components which resolves the violation;
   generate a second updated BIM based on the third list of candidate components; and
   provide the second updated BIM and the third list of candidate components.

2. The system of claim 1, wherein to determine a list of candidate components, the instructions further direct the processing system to select at least one candidate component from a catalog of pre-defined components.

3. The system of claim 2, wherein the catalog of components comprises information about each component, where the information is selected from the group consisting of cost per unit, component availability, component weight, and component dimensions.

4. The system of claim 2, wherein to determine a list of candidate components, the instructions further direct the processing system to:
   identify a set of parameters that describe the feature; and
   locate a set of components in the catalog of components that corresponds to the set of parameters.

5. The system of claim 1, wherein the instructions further direct the processing system to:
   receive an input describing the addition of at least one component to the programmatic design of the structure; and
   update the programmatic description of the building with the at least one component.

6. The system of claim 1, wherein the processing system determines, for each feature, the list of candidate components corresponding to the identified features utilizing a separate processing thread.

7. The system of claim 1, wherein the processing system is a distributed processing system.

8. The system of claim 1, wherein the programmatic description of the structure comprises a set of components that make up the structure, and wherein each component in the set of components is assigned a unique identifier.

9. The system of claim 1, wherein the plurality of rules for the structure comprise rules selected from the group consisting of: building code violations, physical laws, and user-defined rules.

10. A method for generating a programmatic description of a design of a structure, comprising:
    receiving a building information model (BIM);
    identifying features in the BIM;
    determining a list of candidate components corresponding to the identified features from the BIM;

resolving parameters for each component in the list of candidate components;

generating a programmatic description of the structure based on the list of candidate components of the resolved parameters;

receiving a first updated BIM;

identify updated features in the first updated BIM;

determining a second list of candidate components corresponding to the updated features;

updating the programmatic description of the structure based on the second list of candidate components;

performing an error check to determine whether a rule in a plurality of rules for the structure has been violated using the programmatic description;

constructing a third list of candidate components based on the second list of candidate components which resolves the violation;

generating a second updated BIM based on the third list of candidate components; and providing the second updated BIM and the third list of candidate components.

11. The method of claim 10, wherein determining a list of candidate components further comprises selecting at least one candidate component from a catalog of pre-defined components.

12. The method of claim 11, wherein the catalog of components comprises information about each component, where the information is selected from the group consisting of cost per unit, component availability, component weight, and component dimensions.

13. The method of claim 11, wherein determining a list of candidate components further comprises:

identifying a set of parameters that describe the feature; and locating a set of components in the catalog of components that corresponds to the set of parameters.

14. The method of claim 10, further comprising:

receiving an input describing the addition of at least one component to the programmatic design of the structure; and updating the programmatic description of the building with the at least one component.

15. The method of claim 10, further comprising determining, for each feature, the list of candidate components corresponding to the identified features utilizing a separate processing thread.

16. The method of claim 10, wherein the method is performed using a distributed processing system.

17. The method of claim 16, wherein the programmatic description of the structure comprises a set of components that make up the structure, and wherein each component in the set of components is assigned a unique identifier.

18. The method of claim 10, wherein the plurality of rules for the structure comprise rules selected from the group consisting of: building code violations, physical laws, and user-defined rules.

* * * * *